(12) United States Patent
Duppils et al.

(10) Patent No.: US 8,330,521 B2
(45) Date of Patent: Dec. 11, 2012

(54) LEVEL SHIFT CIRCUIT WITH IMPROVED DV/DT SENSING AND NOISE BLOCKING

(75) Inventors: Mathias Duppils, El Segundo, CA (US); Min Fang, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/113,764

(22) Filed: May 1, 2008

(65) Prior Publication Data

US 2008/0297223 A1 Dec. 4, 2008

Related U.S. Application Data (60) Provisional application No. 60/915,155, filed on May 1, 2007.

(51) Int. Cl.
*H03L 5/00* (2006.01)
(52) U.S. Cl. .................................................. 327/333
(58) Field of Classification Search .................. 327/538, 327/333
See application file for complete search history.

(56) References Cited

U.S. PATENT DOCUMENTS

2005/0229120 A1 10/2005 Subramanian et al.
2007/0132627 A1* 6/2007 Chen ............................. 341/155

* cited by examiner

*Primary Examiner* — Lincoln Donovan
*Assistant Examiner* — Daniel Rojas
(74) *Attorney, Agent, or Firm* — Farjami & Farjami LLP (57) ABSTRACT

A level shift circuit in accordance with the present application seeks to meet the need of high voltage level shift signaling with minimum delay and power dissipation by using parasitic emulation, blocking of signaling during times of common mode noise, and mismatch filtering to enhance operation robustness to circuit mismatch and delay. A dv/dt sensing circuit is provided to detect any slew in offset between negative supply voltages and ground in a circuit. This detection is used to control a noise canceling circuit to ensure that noise that results from that offset is not propagated to the output of the level shift circuit. A parasitic emulator is preferably used to provide dv/dt sensing. The output of the parasitic emulator is used to activate a noise canceling circuit to prevent noise from reaching the output terminal of the level shift circuit.

20 Claims, 12 Drawing Sheets

LEVEL SHIFT CIRCUIT WITH IMPROVED DV/DT SENSING AND NOISE BLOCKING

CROSS-REFERENCE TO RELATED APPLICATIONS

The present application claims benefit of and priority to U.S. Provisional Patent Application Ser. No. 60/915,155 entitled CURRENT MODE NOISE IMMUNE HIGH VOLTAGE LEVEL SHIFTING SCHEME filed May 1, 2007, the entire contents of which are hereby incorporated by reference herein.

BACKGROUND

1. Field of the Disclosure

The present invention relates to a level shift circuit with improved dv/dt sensing and noise blocking.

2. Related Art

Level shift of high voltage signals (up to several hundred volts) is an essential feature of most power systems. Level shifting allows for isolation between low voltage control signals and a relatively high voltage switching power output, for example. High voltage level shifting is typically accomplished using high voltage isolation technology. However, this technology typically has long propagation delays and a relatively low operating speed. As new applications and system architectures are developed, operational speed requirements are often in the range of Megahertz, thus the delays present in the conventional technology are not acceptable.

More specifically, traditional high voltage level shift schemes have several disadvantages in both cost and performance. First, the Hall effect sensors and optical isolation devices typically used are bulky and slow. Further, these elements are also difficult to integrate onto a chip. As is mentioned above, present technology is also typically subject to low frequency operation in light of the propagation delays noted above. In addition, these systems are also subject to limited pulse width linearity and high power dissipation. Further, some of these systems such as, for example, the cross-coupled high speed level shift circuit described in U.S. Pat. No. 7,212,033 are sensitive to fabrication mismatches.

Accordingly, it would be beneficial to provide a level shift circuit that avoids the problems discussed above.

SUMMARY OF THE INVENTION

It is an object of the present invention to provide a monolithic, high speed, common mode noise immune level shift circuit using dv/dt sensing and control to provide signal level shifting up to several hundreds of volts or more with an operating speed of 10 Mbits or more.

The level shift circuit of the present application preferably uses dv/dt sensing, mismatch filtering and noise signal blocking techniques. An emulator is preferably provided to detect any positive swing in the floating ground and to generate a logic signal that quickly turns on the noise blanking circuit.

The level shift circuit of the present application seeks to meet the need of high voltage level shift signaling with minimum delay and power dissipation by using parasitic emulation for dv/dt sensing, blocking of signaling during times of common mode noise, and mismatch filtering to enhance operation robustness to circuit mismatch and delay. The parasitic capacitance emulating element is chosen as an element similar to the devices causing common mode noise in the high voltage level shift node. The output of the parasitic emulator prevents noise from reaching the level shift output terminal. The level shift signal and noise is delayed through a pulse filter. The pulse filter delay is chosen long enough to compensate for a timing mismatch between the level shift noise, the common mode noise detector signal, and the delay to disable noise from propagating to the output terminal.

A dv/dt sensing circuit for use in a level shift down circuit including a midwell and a lowside in accordance with an embodiment of the present application includes a parasitic capacitance emulator positioned in the midwell and a resistor positioned in the lowside and connected to the parasitic capacitance emulator, such that a detect voltage is provided at a node between the parasitic capacitance emulator and the resistor when a midwell negative supply voltage changes relative to ground. The dv/dt sensing circuit provides a detect signal based on the detect voltage.

A dv/dt sensing circuit for use in a level shift up circuit including a highside and a lowside in accordance with an embodiment of the present application includes a parasitic capacitance emulator positioned in the lowside and a resistor positioned in the highside and connected to the parasitic capacitance emulator, such that a detect voltage is provided at a node between the parasitic capacitance emulator and the resistor when a highside negative supply voltage changes relative to ground. The dv/dt sensing circuit provides a detect signal based on the detect voltage.

A noise canceling circuit for use in a level shift down circuit including a midwell and a lowside in accordance with an embodiment of the present application includes a first disable block positioned in the lowside and operable to disable level shift signaling based on a control signal. A second disable block may be positioned in the lowside in front a pulse filter and operable to prevent a noise signal from passing to the pulse filter based on the control signal. In addition, a third disable block may be positioned in the lowside at an output of the pulse filter and prior to an output terminal of the level shift down circuit, the third disable device is preferably operable to prevent any noise signal from passing from the pulse filter to the output terminal of the level shift down circuit based on the control signal. Preferably, at least one of the first disable block, the second disable block and/or the third disable block prevents propagation of noise signals to the output terminal of the level shift down circuit.

A noise canceling circuit for use in a level shift up circuit including a highside and a lowside in accordance with an embodiment of the present application includes a first disable block positioned in the highside and operable to disable level shift signaling based on a control signal. A second disable block may be positioned in the highside in front of a pulse filter and operable to prevent a noise signal from passing to the pulse filter. A third disable block positioned in the highside at an output of the pulse filter and prior to an output terminal of the level shift up circuit, the third disable device operable to prevent any noise signal from passing from the pulse filter to the output terminal based on the control signal. In a preferred embodiment, at least one of the first disable block, the second disable block and/or the third disable block prevents propagation of noise signals to the output terminal of the level shift up circuit.

A level shift down integrated circuit including a midwell and a lowside in accordance with an embodiment of the present application includes a dv/dt sensing circuit operable to detect when a midwell negative supply voltage changes relative to ground and to provide a detect signal indicating that the midwell negative supply voltage has changed relative to ground and a noise canceling circuit positioned in the lowside and operable to prevent a noise signal from propagating to an output of the level shift down circuit based on the detect signal.

A level shift up integrated circuit including a highside and a lowside in accordance with an embodiment of the present application includes a dv/dt sensing circuit operable to detect when a highside negative supply voltage changes relative to ground and to provide a detect signal indicating that the highside negative supply voltage has changed relative to ground and a noise canceling circuit positioned in the highside and operable to prevent a noise signal from propagating to an output of the level shift up circuit based on the detect signal.

Other features and advantages of the present invention will become apparent from the following description of the invention which refers to the accompanying drawings.

DETAILED DESCRIPTION

The level shift circuit of the present application provides a novel approach to high speed level shifting with hundreds of volts isolation that also allows for the rejection of common mode noise up to 100V/ns using standard CMOS processing technology, The level shift circuit of the present application integrates dv/dt sensing and noise signal blocking techniques. An active device is used as the sensing element to detect any swing in the floating ground and to generate a logic level and quickly turn on the noise blanking circuit.

Figure 1:
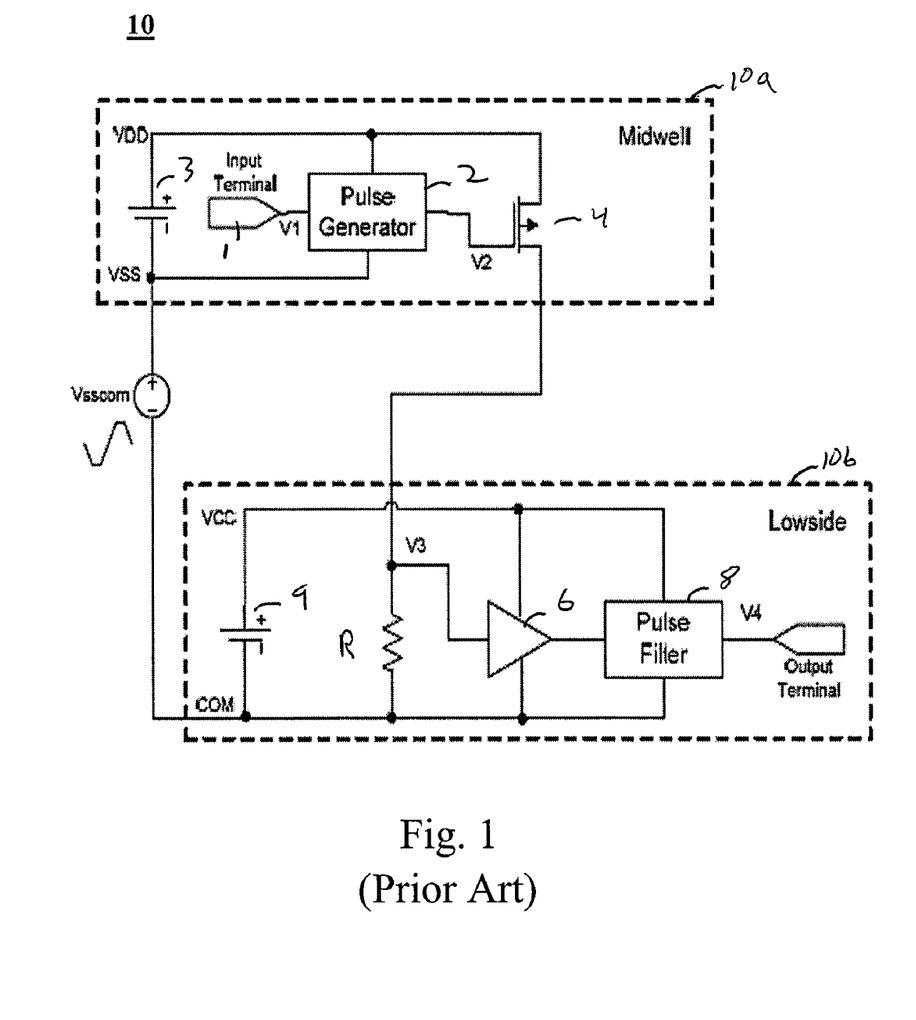
FIG. 1 illustrates an example of a convention level shift down circuit.

Electrical signaling between circuits whose ground references differ by several hundred volts requires a level shift circuit. Level shift circuits that transmit a signal from a high ground potential to a low ground potential are referred to as level shift down circuits, and level shift circuits that transmit a signal from a low ground potential to a high ground potential are called level shift up circuits. FIG. 1 illustrates an example of a prior art level shift down circuit while FIG. 2 illustrates an example of a level shift up circuit.

The isolated high voltage (HV) domains of a monolithic integrated circuit are referred to as the midwell, lowside and highside. The prior art level shift down circuit 10 of FIG. 1 has a midwell 10a and a lowside 10b. The midwell typically includes an input terminal (V1), pulse generator 2, a high voltage PMOS transistor 4 and a power supply 3. The pulse generator 2 typically generates a pulse of fixed length when triggered which controls the transistor 4, for example, in FIG. 1. In FIG. 1, the drain of the transistor 4 includes a node designated V3 and connects to a pull down resistor R on the lowside 10b. The lowside 10b typically includes a resistor R, an amplifier 6, a pulse filter 8 and a power supply 9. The pulse filter 8 delays positive edges but feeds forward negative edges without significant delay. VDD and VCC are positive supply terminals, VSS is a negative supply terminal and COM is ground. The midwell's negative supply is elevated by Vsscom volts relative to COM.

Figure 2:
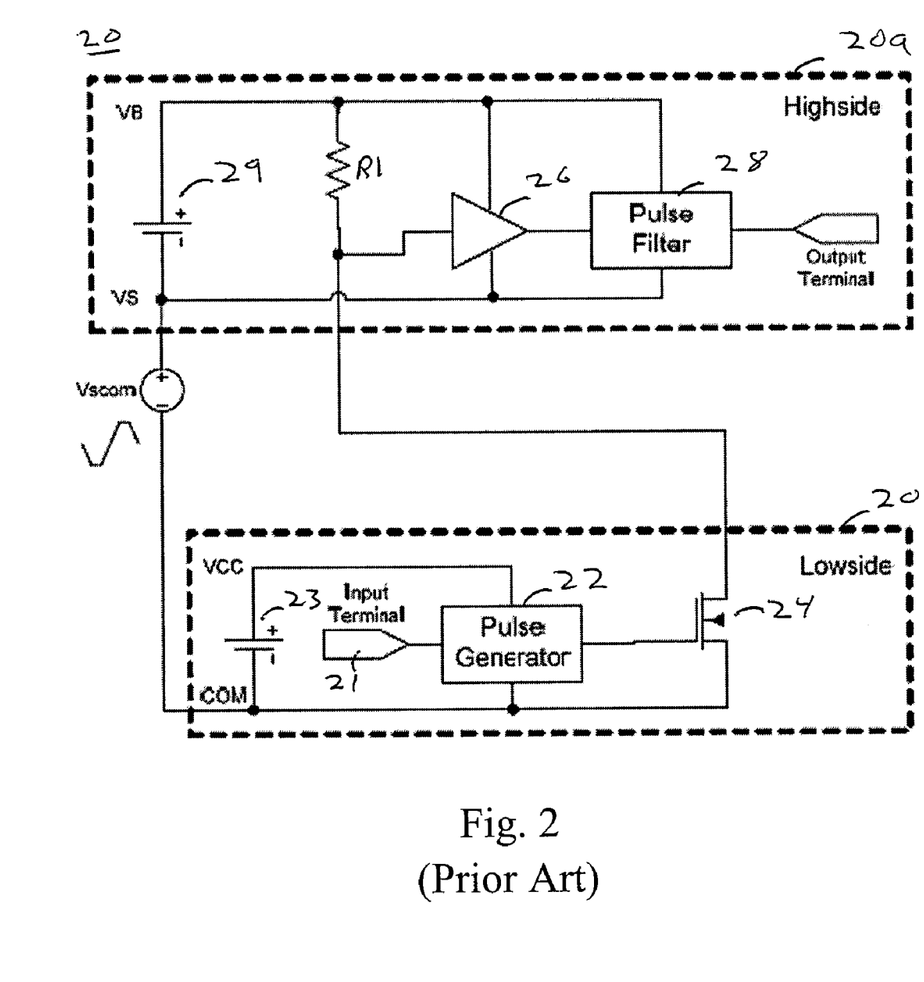
FIG. 2 illustrates an example of a convention level shift up circuit.

The prior art level shift up circuit 20 illustrated in FIG. 2 includes a lowside 20b and a highside 20a. The lowside 20b includes input terminal 21, pulse generator 22, high voltage NMOS level shift transistor 24 and power supply 23. The drain of the transistor 24 is referred to as the level shift node and connects to a pull up resistor R1 of the highside 20a. The highside 20a includes the resistor R1, a comparator 26, a pulse filter 28 and a power supply 29. The pulse filter 28 is provided to reject any common mode or dv/dt related noise in the level shift channel, thus the pulsewidth from the lowside 20b must have a duration that is longer than the harmful dv/dt slew time. VB and VC are positive supply terminals and VS is a negative supply terminal while COM is ground, The highside negative supply VS is elevated by Vscon relative to ground.

Figure 7:
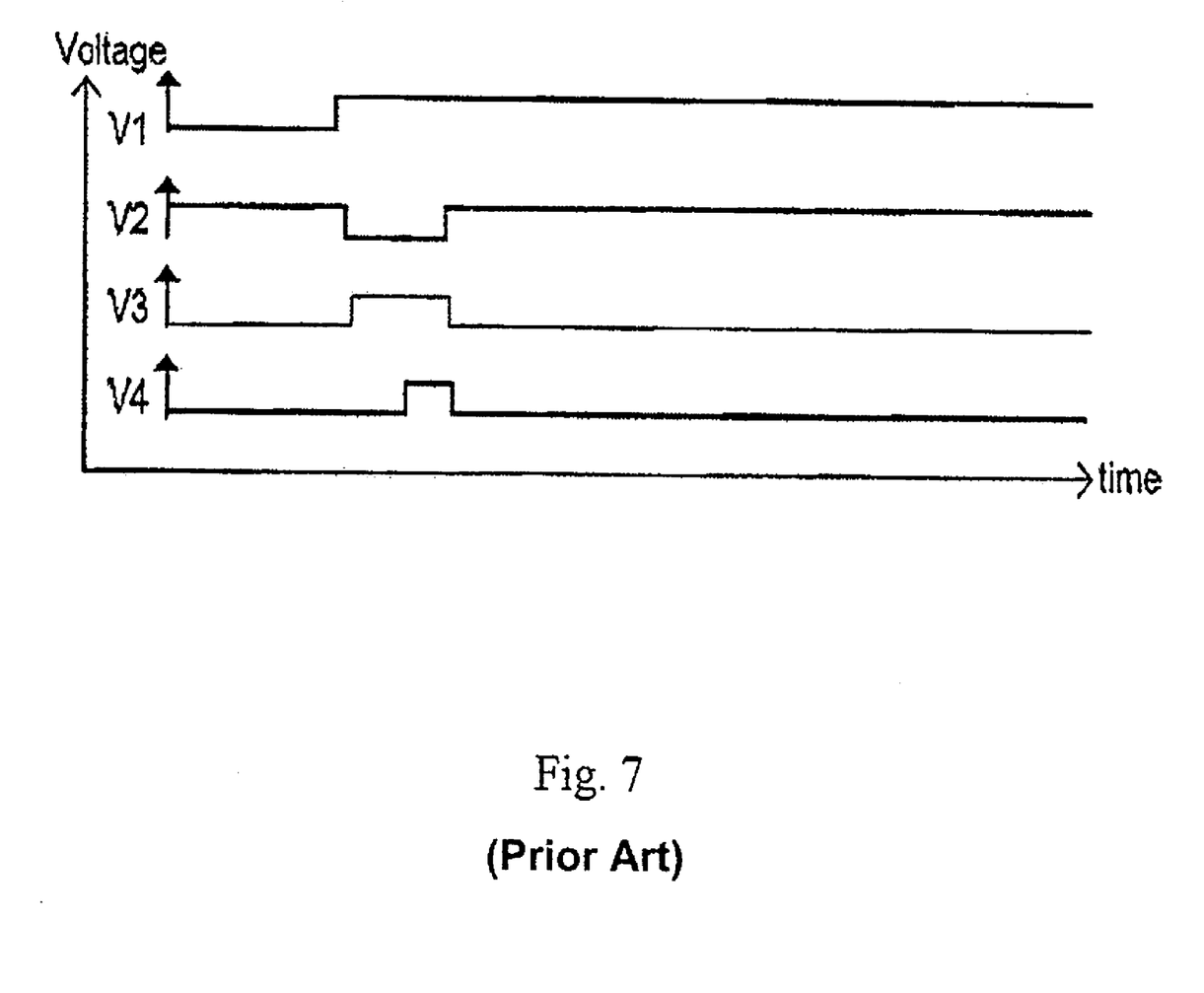
FIG. 7 is a graph illustrating typical waveforms of the level shift down circuit of FIG. 1.

FIG. 7 illustrates typical waveforms during operation of a prior art level shift down circuit, such as that illustrated in FIG. 1. Activity at the input node (V1) triggers the pulse generator 2 to generate a pulsed control waveform (on V2) to the high voltage PMOS transistor 4. When active, the transistor 4 pulls up the voltage at node V3 (the level shift node). The pulse waveform is transferred via the comparator (amplifier 6) to the pulse filter 8, and after a delay to the output node or terminal V4.

Figure 3:
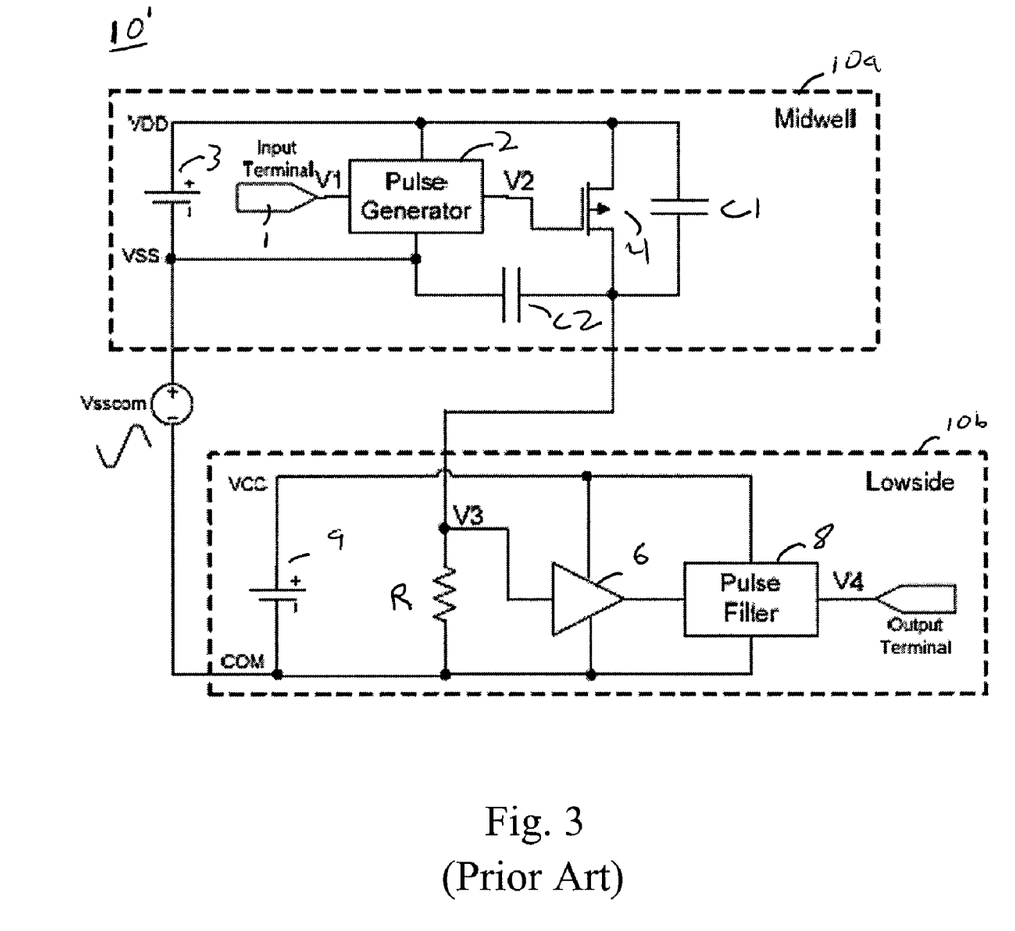
FIG. 3 illustrates the level shift down circuit of FIG. 1 with parasitic capacitances shown explicitly.
Figure 8:
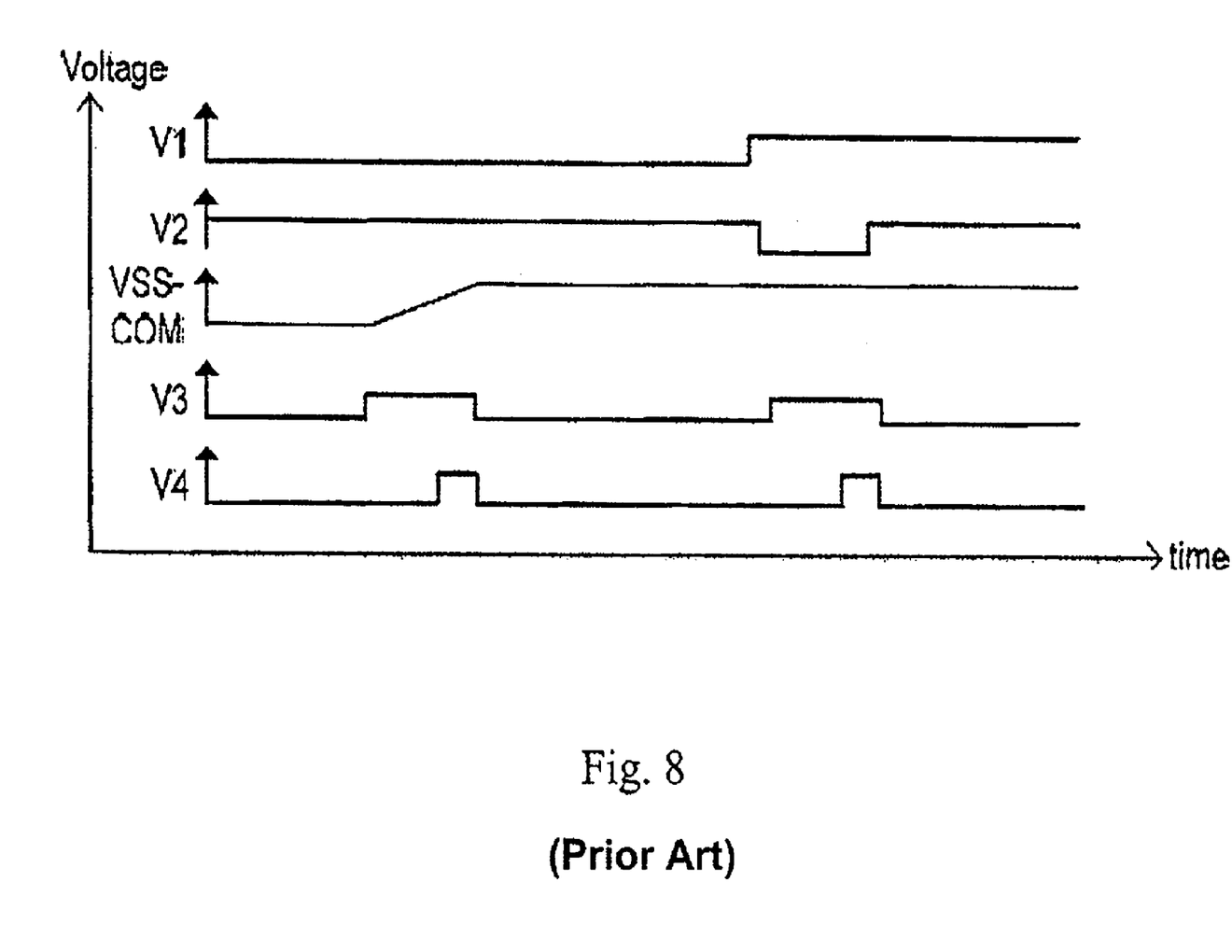
FIG. 8 is a graph illustrating the timing diagram of the level shift down circuit of FIG. 3.

FIG. 3 illustrates a level shift down circuit $10^1$ with parasitic capacitance C1 between VDD and V3 and C2 from VSS to V3. Otherwise, the circuit 101 is substantially similar to the circuit 10 of FIG. 1. These capacitances may be the result of a reverse-biased junction of the PMOS transistor 4, for example. When the VSS potential changes compared to COM, a current is injected via these capacitors to node V3. The pulse filter 8 operates to block noise during the maximum assumed slew rate time and therefore the transmitted pulse width and pulse filter delay is long. FIG. 8 shows the timing diagram of the prior art level shift down circuit where the time constant of the pulse filter 8 is incorrectly chosen to be shorter than the dv/dt event duration such that noise is provided at the level shift channel output node V4.

Figure 4:
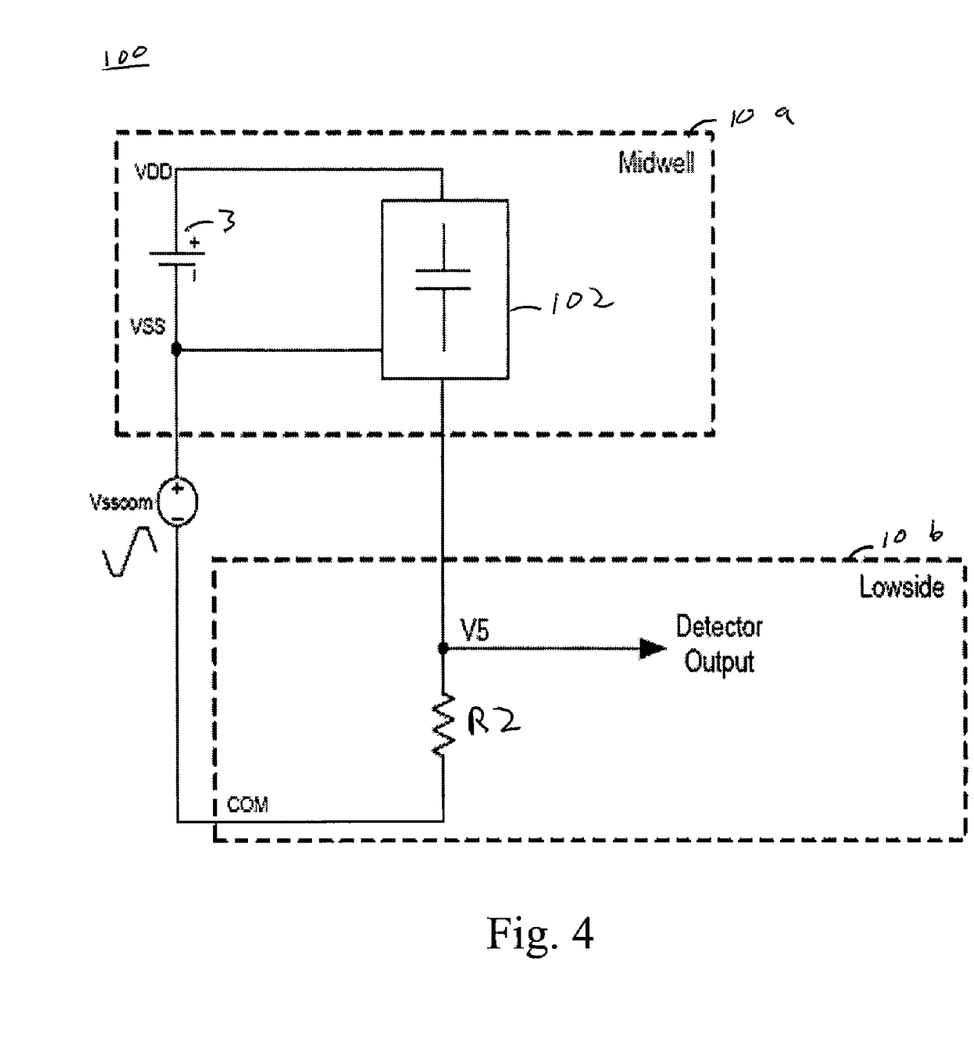
FIG. 4 illustrates a dv/dt sensing circuit in accordance with an embodiment of the present application.
Figure 4A:
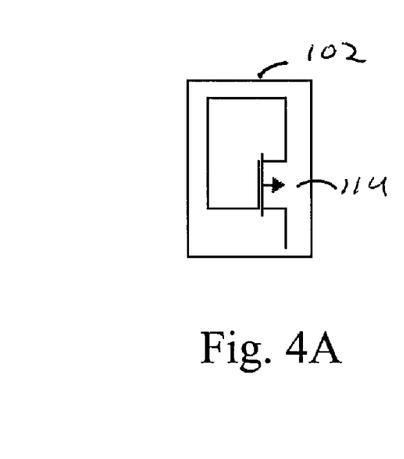
FIG. 4A is a detailed view of a parasitic capacitance emulator of the dv/dt sensing circuit of FIG. 4.

A dv/dt event is defined as an event when switching ground potentials, such as VSS or VS switch relative to COM such that an error may result at the level shift output. FIG. 4 illustrates an example of a dv/dt sensing circuit in accordance with an embodiment of the present application. The circuit 100 includes a parasitic capacitance emulator 102 in the midwell 10a. The midwell 10a also include a power source 103. The emulator 102 is connected to a lowside resistor R2 which is preferably positioned in the lowside 10b. The emulator 102 and the resistor R2 are connected to the node V5, which also provides the detect signal. The emulator emulates the parasitic capacitances C1, C2, for example of FIG. 3 to predict when noise will be introduced into the circuit. The detect signal provided from node V5 activates at any positive offset shift and assumes amplitude, timing and duration similar to that of the noise in the level shift channel. The detect signal is used to control the blocking of the dv/dt related noise in the level shift channel. FIG. 4A illustrates an exemplary embodiment of the emulator 102. In this embodiment, the emulator 102 is implemented as a diode connected high voltage PMOS transistor 114. That is, the gate of the transistor 114 is tied to VDD. The amplitude of the detect signal at node V5 may be adjusted by changing the value of the resistor R2 and/or by increasing the emulated parasitic capacitance.

Figure 9:
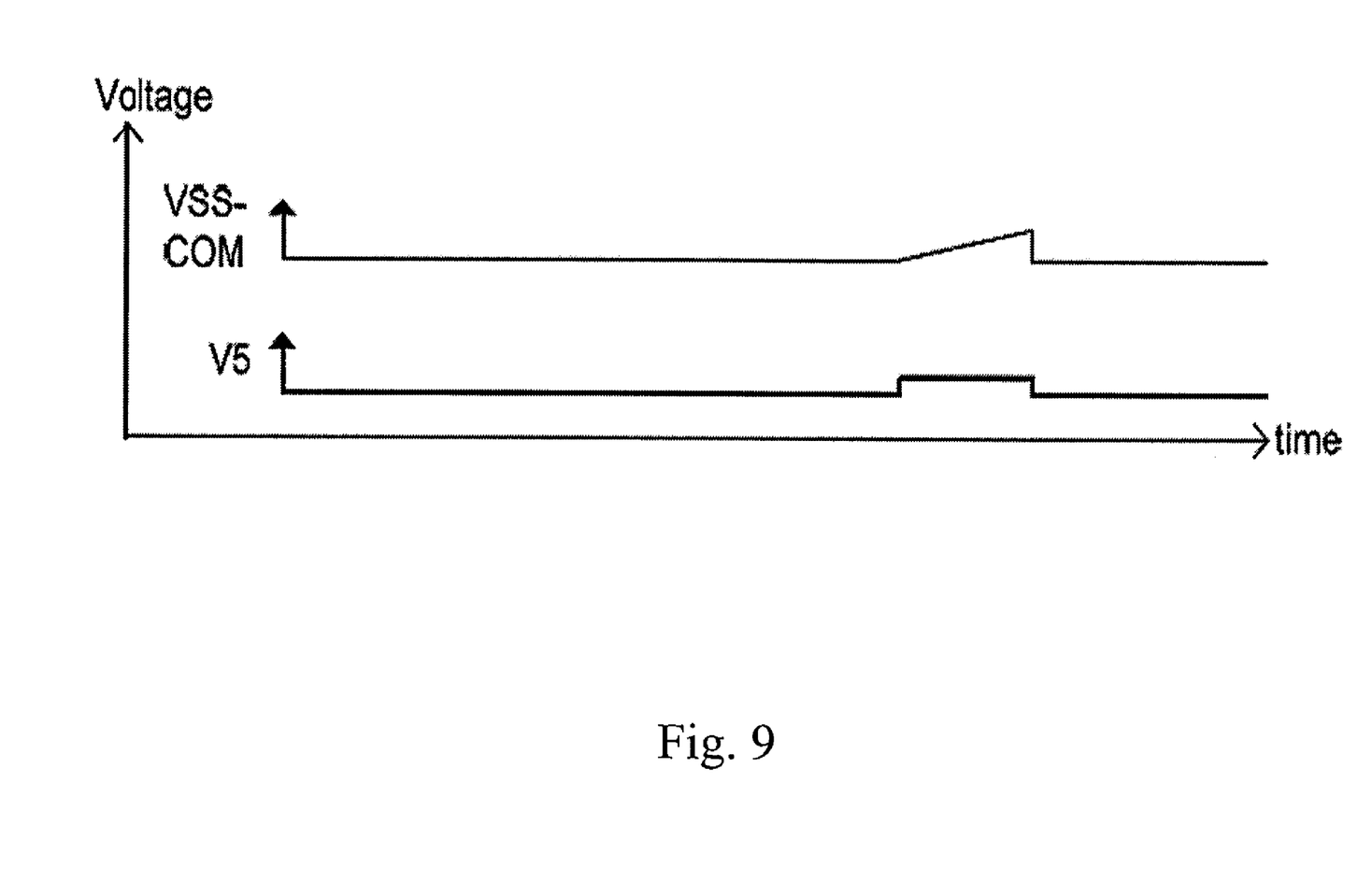
FIG. 9 is a graph illustrating the waveforms of the circuit of FIG. 4.

FIG. 9 illustrates timing waveforms of the circuit of FIG. 4. When the VSS potential changes relative to COM, a current is injected into node V5 leading to a voltage developing across resistor R2. The parasitic capacitance emulator 102 is connected to the pull down resistor R2 in the lowside 102b such that any alteration in the ground offset (VSS-COM) between the midwell 102a and lowside causes a voltage across the resistor R2.

Figure 5:
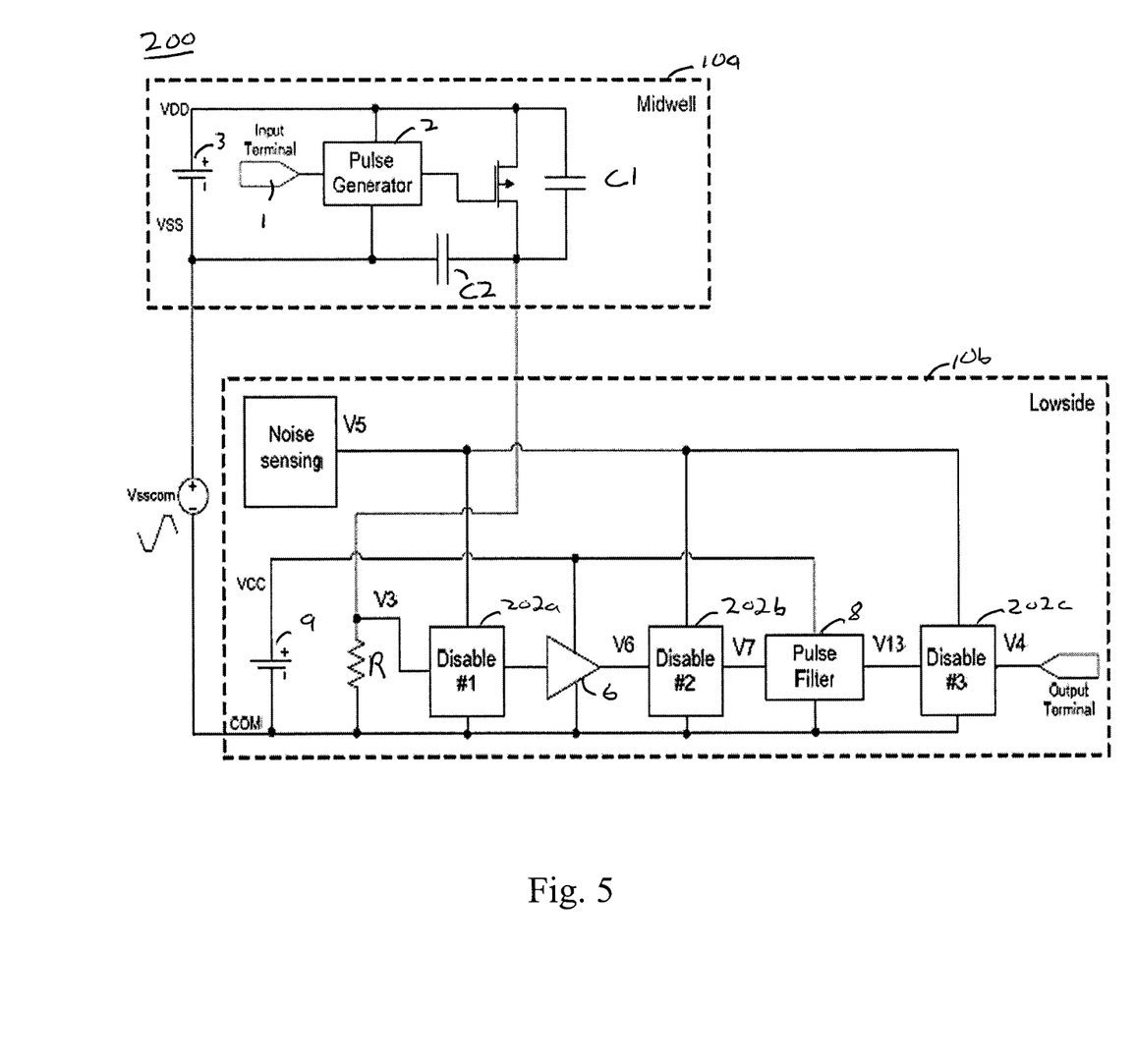
FIG. 5 illustrates a noise blocking circuit in accordance with an embodiment of the present application.

FIG. 5 illustrates a level shift down circuit 200 in accordance with an embodiment of the present application that blocks level shift signaling whenever noise is predicted. The circuit preferably includes three disable blocks, or devices, 202a, 202b, 202c but otherwise includes components similar to the circuit of FIG. 1. The first disable block 202a prevents level shift signaling based on a control signal, preferably the detect signal from node V5 mentioned above. The second disable block 202b prevents noise from entering the pulse filter 8. That is, it is positioned at an input to the pulse filter 8 and prevent noise signals from being passed to the filter 8 based on the control signal. The third disable block 202c prevents noise at the pulse filter output from reaching the output terminal of the level shift circuit based on the detect signal. As is noted above, the disable blocks 202a, 202b, 202c are controlled by the detect signal (from node V5). However, the disable blocks 202a, 202b, 202c, are preferably only active when the detect signal is large enough to potentially cause an error at the output terminal of the level shift circuit. That is, when the floating ground changes relative to ground by a sufficient amount to introduce noise. While the blocks 202a, 202,b, 202c are all illustrated in FIG. 5, any one of the disable blocks may be used to prevent noise from propagating to the output terminal of the level shift circuit. That is, the circuit 200 need not include all of the disable blocks 202a, 202b, 202c to prevent noise from propagating to the output of the circuit. Any individual block or combination of the disable blocks may be used instead. While it is preferable to provide the disable block, or blocks, prior to the filter 8, any desired configuration may be used. The disable blocks 202a, 202b and 202c may be implemented to block noise signals in any desired manner, including but not limited to logic units.

The pulse filter 8 in FIG. 5 prevents dv/dt induced noise from propagating to the output whenever there is a mismatch between the level shift channel noise and the blocking mechanism including dv/dt detect signal delay. Since the mismatch time is typically much shorter than the dv/dt event duration, the pulse filter time constant can be made much shorter compared to the prior art level shift circuits discussed above where the pulse filter time must be longer than the maximum dv/dt event duration. Shorter pulse filter time reduces propagation delay and allows for reduced pulse generator time, and thus reduces power consumption. Thus, using a shorter pulse filter delay also allows the duration of the level shift pulse width to be reduced such that shorter throughput delay and reduced power consumption is achieved.

Figure 6A:
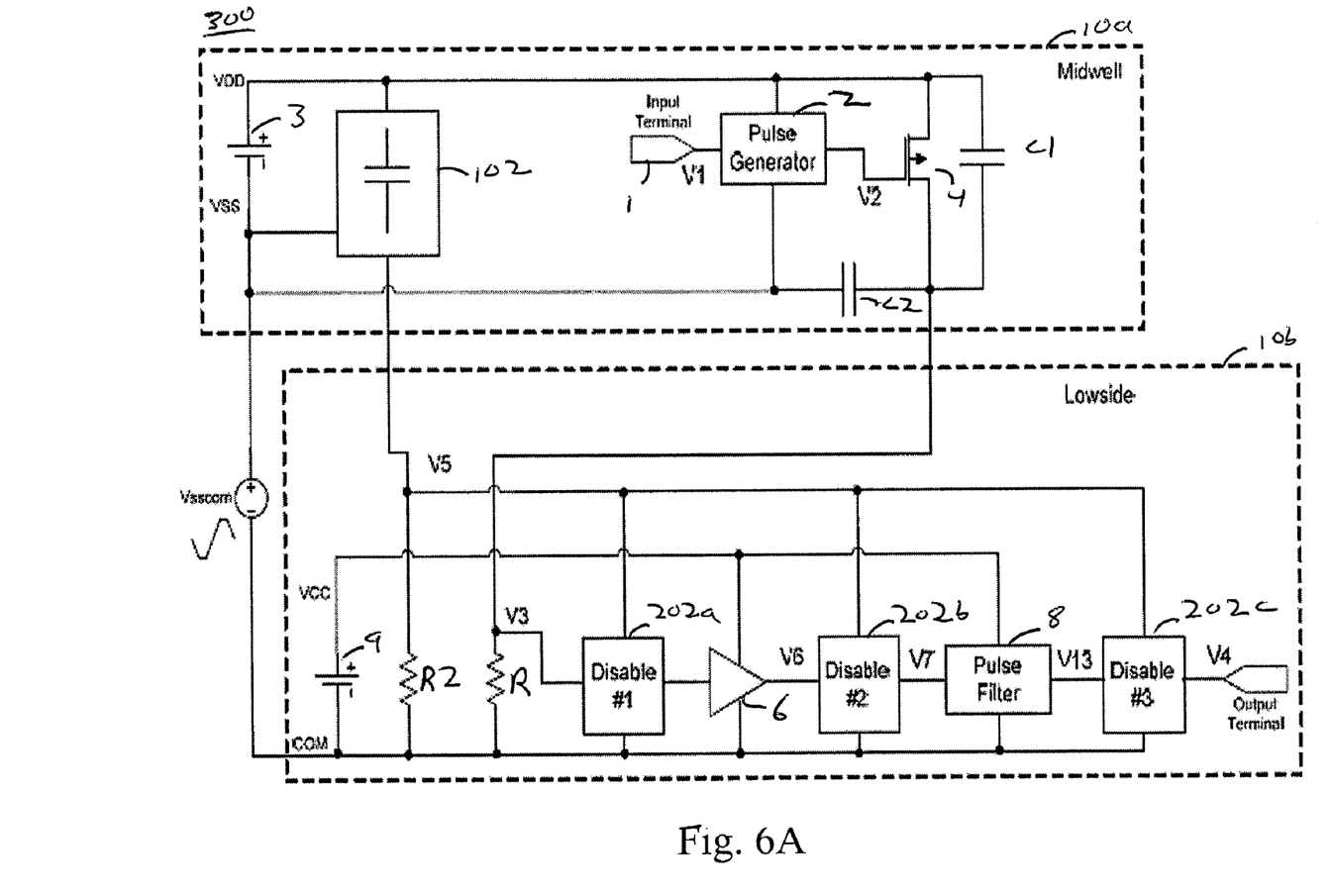
FIG. 6A illustrates a level shift down circuit including the dv/dt sensing circuit of FIG. 4 and the noise canceling circuit of FIG. 5.
Figure 10:
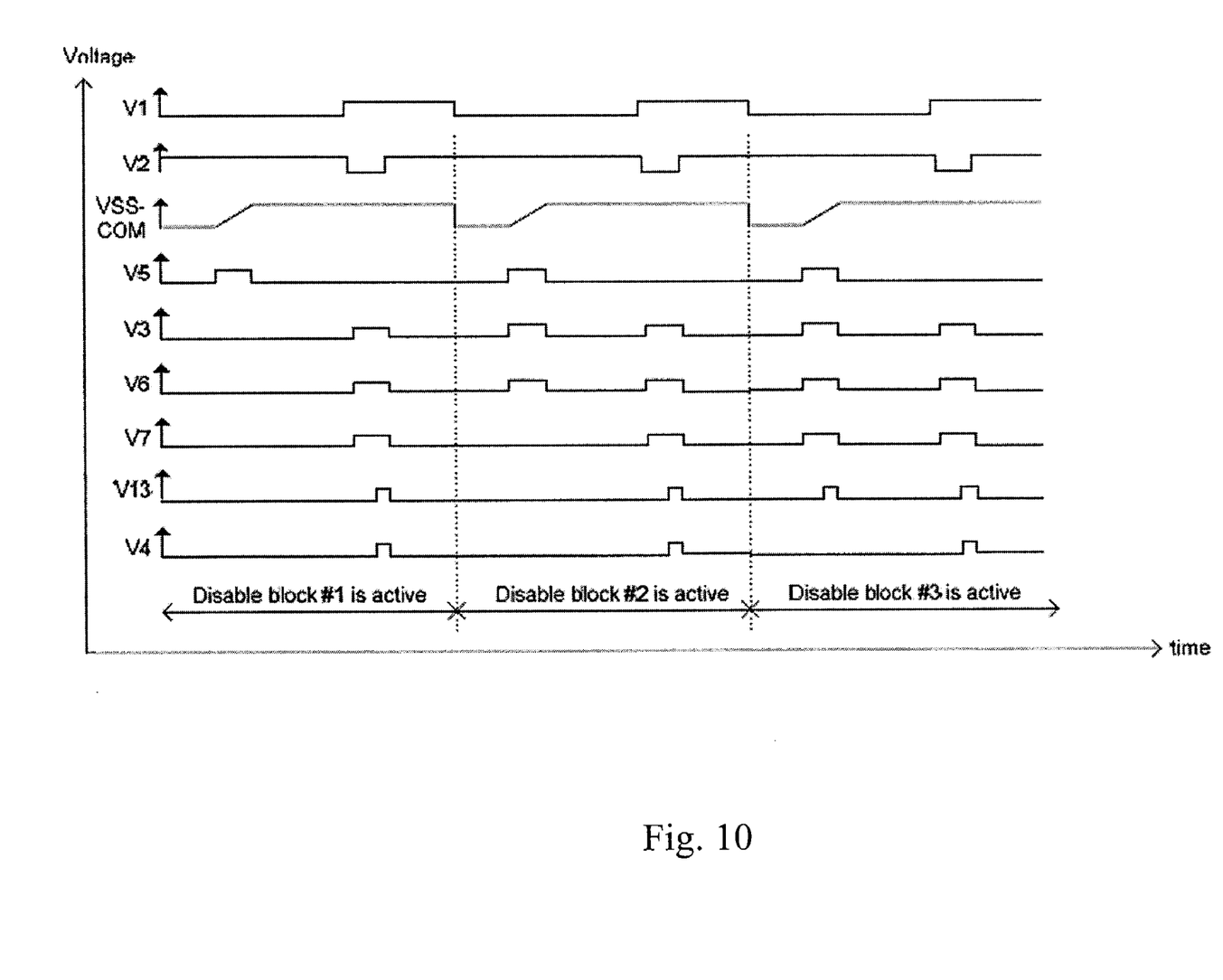
FIG. 10 is a graph illustrating the waveforms of FIG. 6A.

FIG. 6A illustrates a level shift down circuit 300 in accordance with an embodiment of the present application that includes the dv/dt sensing provided by the circuit of FIG. 4 and the noise blocking provided by the circuit of FIG. 5. The circuit of FIG. 6A is similar to that of FIG. 3 except that it also includes the improvements provided by the circuits of FIGS. 4 and 5. FIG. 10 illustrates a timing diagram for the circuit 300 of FIG. 7. The diagram of FIG. 10 illustrates the input voltage (V1) the HV PMOS transistor control voltage (V2), the positive slew of vss-com offset voltage (VSS-COM), the dv/dt detect signal voltage (V5), the level shift channel voltage (V3), the buffered level shift voltage before and after the level shift channel voltage (V6 and V7), the pulse filter output voltage (V13) and the level shift circuit output voltage (V4). The waveforms on the left side of the diagram show successful blocking of noise during a dv/dt event by the disable block 202a. The waveforms in the center show successful blocking of noise during a dv/dt event by disable block 202b. The waveforms on the right side of FIG. 10 show successful blocking of noise during a dv/dt event by the disable block 202c. However, as is noted above with respect to FIG. 5, it is not necessary to use all three disable blocks to block noise.

Figure 6B:
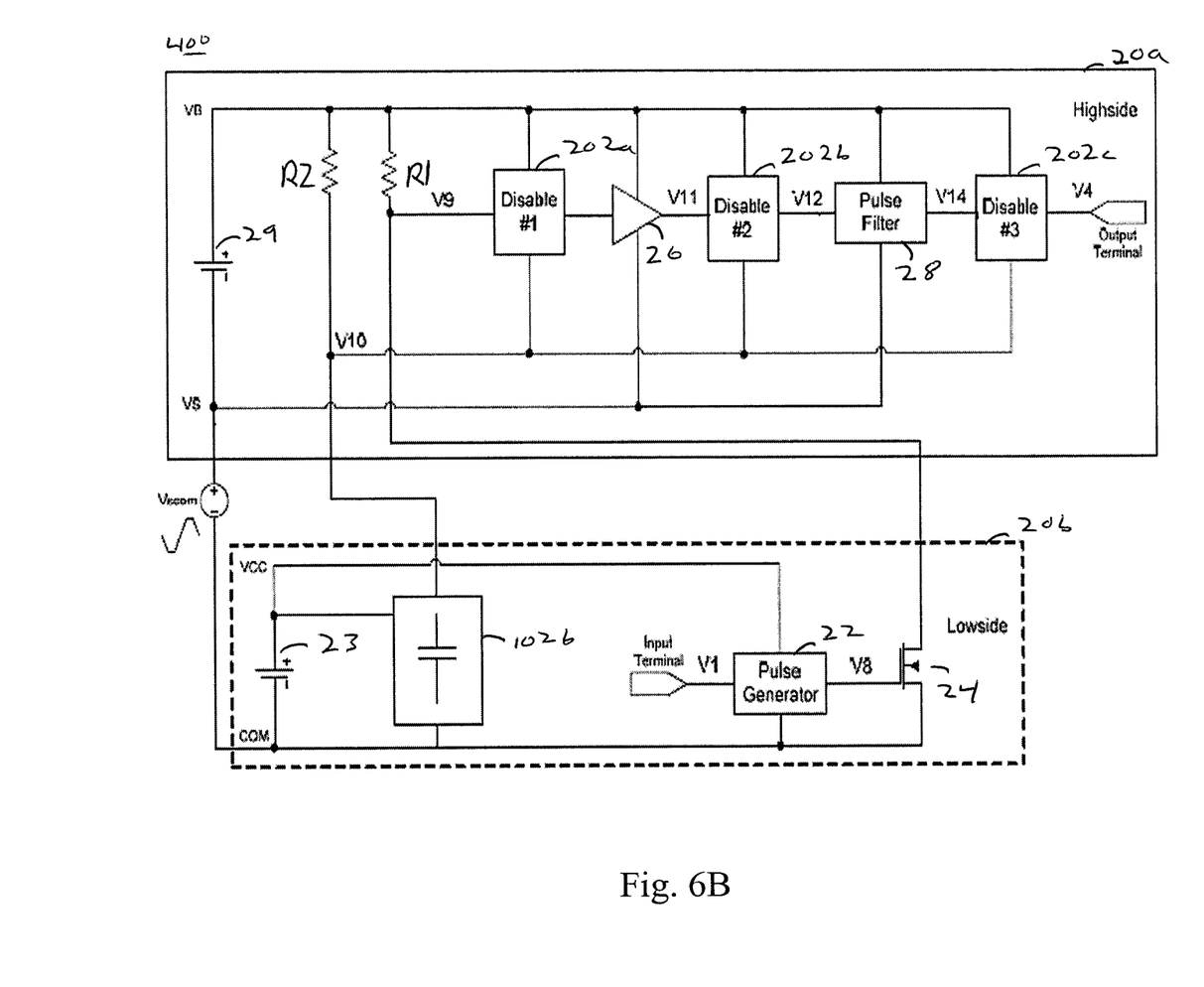
FIG. 6B illustrates a level shift up circuit including the dv/dt sensing circuit of FIG. 4 and the noise canceling circuit of FIG. 5.
Figure 11:
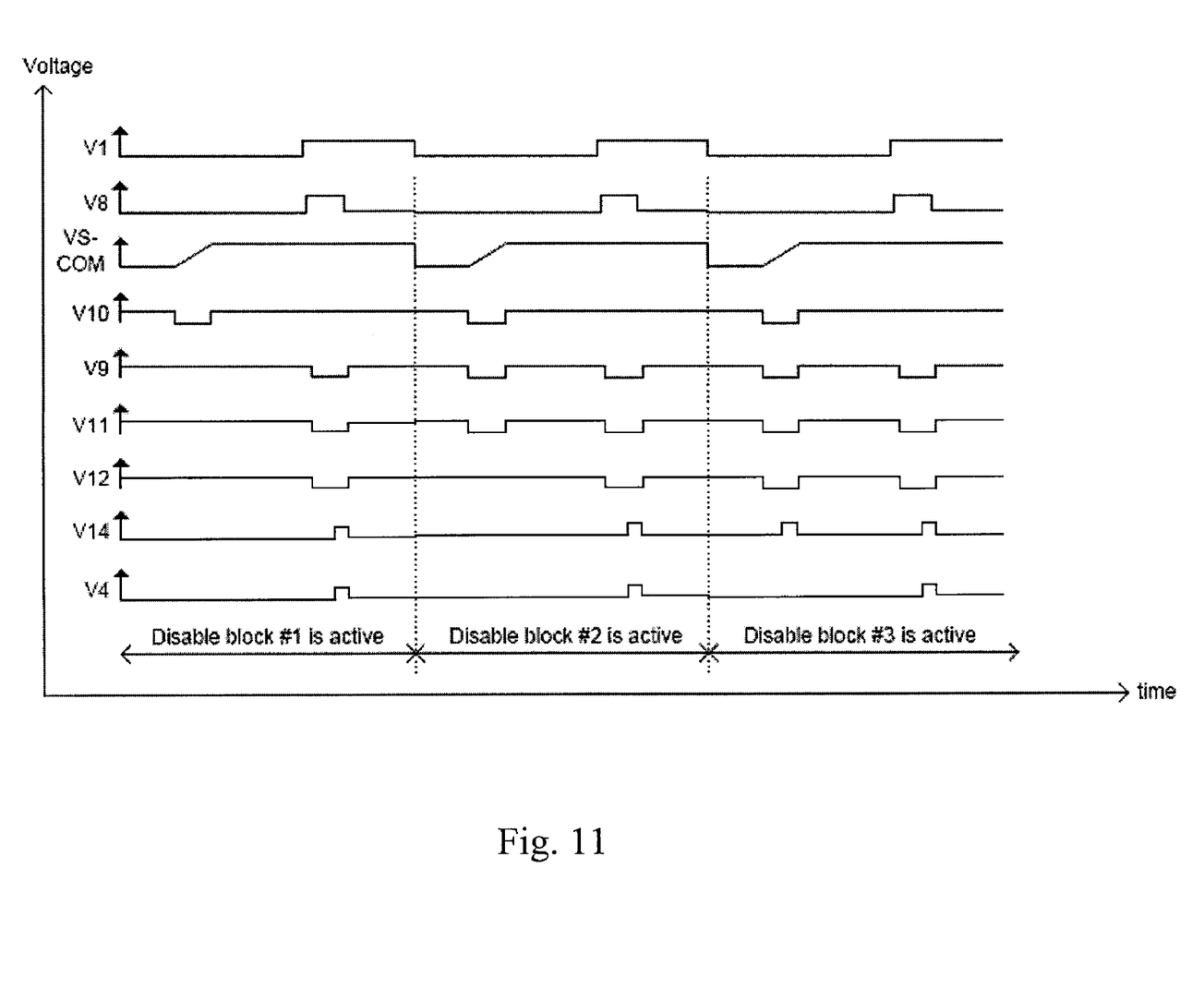
FIG. 11 is a graph illustrating the waveforms of FIG. 6B.

FIG. 6B illustrates a level shift up circuit 400 in accordance with an embodiment of the present application that includes the dv/dt sensing provided by the circuit of FIG. 4 and the noise blocking provided by the circuit of FIG. 5. The circuit of FIG. 6B is similar to that of FIG. 2 except that it includes the advantages offered by the circuits of FIGS. 4 and 5. The polarity of both of these circuits is reversed since the circuit 400 is a level shift up circuit and the circuits of FIGS. 4 and 5 were discussed above relative to a level shift down circuit. Otherwise, their operation is very similar to that described above. FIG. 11 illustrates a timing diagram of the circuit FIG. 8. The diagram of FIG. 11 illustrates the input voltage (V1) the HV NMOS transistor control voltage (V8), the positive slew of vs-com offset voltage (VS-COM), the dv/dt detect signal voltage (V10), the level shift channel voltage (V9), the buffered level shift voltage before and after the disable block (V11 and V12), the pulse filter output voltage (V14) and the level shift circuit output voltage (V4). The waveforms on the left side of the diagram show successful blocking of noise during a dv/dt event by the disable block 202a. The waveforms in the center show successful blocking of noise during a dv/dt event by disable block 202b. The waveforms on the right side show successful blocking of noise during a dv/dt event by disable block 202c. As is noted above, it is not necessary to use all three disable blocks to block noise from reaching the output.

Thus, the level shift circuit of the present application provides improved dv/dt sensing which can be used to trigger noise blocking such that propagation delays can be minimized and power consumption reduced.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A level shift down circuit including a midwell connected to a lowside at a level shift node, said level shift down circuit comprising:
   a dv/dt sensing circuit configured to provide a detect signal at another node when a midwell negative supply voltage changes relative to ground, said detect signal indicating that said midwell negative supply voltage has changed relative to ground to predict a noise signal; and
a noise canceling circuit positioned in said lowside and configured to prevent said noise signal from propagating to an output terminal of said level shift down circuit responsive to said detect signal.

2. The level shift down circuit of claim 1, wherein said dv/dt sensing circuit further comprises:
a parasitic capacitance emulator positioned in said midwell; and
a resistor positioned in said lowside and connected to said parasitic capacitance emulator at said another node such that a detect voltage of said detect signal is provided at said another node when said midwell negative supply voltage changes relative to ground.

3. The level shift down circuit of claim 2, wherein said noise canceling circuit further comprises:
a first disable block positioned in said lowside and operable to prevent said noise signal from propagating therethrough responsive to said detect signal.

4. The level shift down circuit of claim 3, wherein said noise canceling circuit further comprises:
a second disable block positioned in said lowside in front of a pulse filter, said second disable block operable to prevent said noise signal from passing to said pulse filter based on said detect signal; and
a third disable block positioned in said lowside at an output of said pulse filter and prior to said output terminal of said level shift down circuit, said third disable block operable to prevent said noise signal from passing from said pulse filter to said output terminal of said level shift down circuit based on said detect signal,
wherein at least one of said first disable block, said second disable block and said third disable block prevents propagation of said noise signal to said output terminal of said level shift down circuit.

5. A level shift up circuit including a highside connected to a lowside at a level shift node, said level shift up circuit comprising:
a dv/dt sensing circuit configured to provide a detect signal at another node when a highside negative supply voltage changes relative to ground, said detect signal indicating that said highside negative supply voltage has changed relative to ground to predict a noise signal; and
a noise canceling circuit positioned in said highside and configured to prevent said noise signal from propagating to an output terminal of said level shift up circuit responsive to said detect signal.

6. The level shift up integrated circuit of claim 5, wherein said dv/dt sensing circuit further comprises:
a parasitic capacitance emulator positioned in said lowside; and
a resistor positioned in said highside and connected to said parasitic capacitance emulator at said another node such that a detect voltage of said detect signal is provided at said another node when said highside, negative supply voltage changes relative to ground.

7. The level shift up circuit of claim 5, wherein said noise canceling circuit further comprises:
a first disable block positioned in said highside and operable to prevent said noise signal from propagating therethrough responsive to said detect signal.

8. The level shift up circuit of claim 7, wherein said noise canceling circuit further comprises:
a second disable block positioned in said highside in front of a pulse filter and operable to prevent said noise signal from passing to said pulse filter based on said detect signal; and
a third block device positioned in said highside at an output of said pulse filter and prior to said output terminal of said level shift up circuit, said third disable device operable to prevent said noise signal from passing from said pulse filter to said output terminal based on said detect signal,
wherein at least one of said first disable block, said second disable block and said third disable block prevents propagation of said noise signal to said output terminal of said level shift up circuit.

9. A level shift circuit comprising:
a noise canceling circuit configured to prevent a noise signal at a level shift node from propagating to an output terminal of said level shift circuit, said noise canceling circuit responsive to a detect signal provided at another node, said detect signal indicating that a supply voltage has changed relative to a ground to predict said noise signal.

10. The level shift circuit of claim 9, wherein said level shift circuit comprises a level shift down circuit including a midwell and a lowside, said supply voltage comprising a midwell negative supply voltage.

11. The level shift circuit of claim 9, wherein said level shift circuit comprises a level shift up circuit including a highside and a lowside, said supply voltage comprising a highside negative supply voltage.

12. The level shift circuit of claim 9, wherein said noise canceling circuit comprises:
a disable block operable to prevent said noise signal from propagating therethrough responsive to said detect signal.

13. The level shift circuit of claim 9, wherein said noise canceling circuit comprises:
a disable block positioned in front of a pulse filter and operable to prevent said noise signal from passing to said pulse filter based on said detect signal.

14. The level shift circuit of claim 9, wherein said noise canceling circuit comprises:
a disable block positioned at an output of a pulse filter and prior to said output terminal of said level shift circuit, said disable block operable to prevent said noise signal from passing from said pulse filter to said output terminal of said level shift circuit based on said detect signal.

15. The level shift circuit of claim 9, wherein said detect signal is provided by a dv/dt sensing circuit comprising a parasitic capacitance emulator.

16. The level shift circuit of claim 15, wherein said parasitic capacitance emulator comprises a diode connected high voltage metal-oxide-semiconductor field-effect transistor.

17. The level shift circuit of claim 15, wherein said dv/dt sensing circuit comprises:
a resistor connected to said parasitic capacitance emulator such that a detect voltage of said detect signal is provided at said another node between said parasitic capacitance emulator and said resistor when said supply voltage changes relative to ground.

18. The level shift circuit of claim 17, wherein said level shift circuit comprises a level shift down circuit including a midwell and a lowside;
said parasitic capacitance emulator positioned in said midwell and said resistor positioned in said lowside.

19. The level shift circuit of claim 17, wherein said level shift circuit comprises a level'shift up circuit including a highside and a lowside;

said parasitic capacitance emulator positioned in said lowside and said resistor positioned in said highside.

20. The level shift circuit of claim 9, further comprising a pulse filter, said pulse filter configured to delay propagation of a level shift signal and said noise signal, wherein said delay is long enough to compensate for a timing mismatch between receiving said noise signal and disabling said noise signal from propagating to said output terminal of said level shift circuit and shorter than said duration of said noise signal.

* * * * *